United States Patent [19]

Sukigara

[11] Patent Number: 5,583,498
[45] Date of Patent: Dec. 10, 1996

[54] INPUT DEVICE

[75] Inventor: Akihiko Sukigara, Tokyo, Japan

[73] Assignee: Canon Kabushiki Kaisha, Tokyo, Japan

[21] Appl. No.: 336,756

[22] Filed: Nov. 8, 1994

Related U.S. Application Data

[63] Continuation of Ser. No. 999,555, Dec. 31, 1992, abandoned, which is a continuation of Ser. No. 656,031, Feb. 15, 1991, abandoned, which is a continuation of Ser. No. 308,635, Feb. 10, 1989, abandoned.

[30] Foreign Application Priority Data

Feb. 12, 1988 [JP] Japan .................................. 63-28841

[51] Int. Cl.$^6$ ...................................................... G06F 1/00
[52] U.S. Cl. ............................................................. 341/25
[58] Field of Search ..................... 341/23–26; 371/57.1, 371/59, 60; 307/542.1; 364/709.15

[56] References Cited

U.S. PATENT DOCUMENTS

| | | |
|---|---|---|
| 3,745,536 | 7/1973 | Klehm, Jr. . |
| 3,792,466 | 2/1974 | Arnold et al. . |
| 4,231,016 | 10/1980 | Ueda .......................................... 341/24 |
| 4,333,089 | 6/1982 | Leininger ................................... 341/26 |
| 4,420,744 | 12/1983 | Jesson ........................................ 341/25 |
| 4,502,038 | 2/1985 | Lowenthal et al. ........................ 341/26 |
| 4,581,603 | 4/1986 | Ingold et al. .............................. 341/24 |
| 4,833,447 | 5/1989 | Sukigara . |

FOREIGN PATENT DOCUMENTS 0188151  7/1986  European Pat. Off. .................. 341/26

*Primary Examiner*—Brian Zimmerman
*Attorney, Agent, or Firm*—Fitzpatrick, Cella, Harper & Scinto

[57] ABSTRACT

In an input device, switches are disposed at points of intersection of an n×m matrix, a scanning signal is applied from rows or columns of the matrix, and an operated switch is detected by detecting the scanning signal output from rows or columns. In detecting the operated switch, the detected switches may include the actually-operated switch and a pseudo-operated switch. The input device can prevent the detection of a pseudo-operated switch.

19 Claims, 3 Drawing Sheets

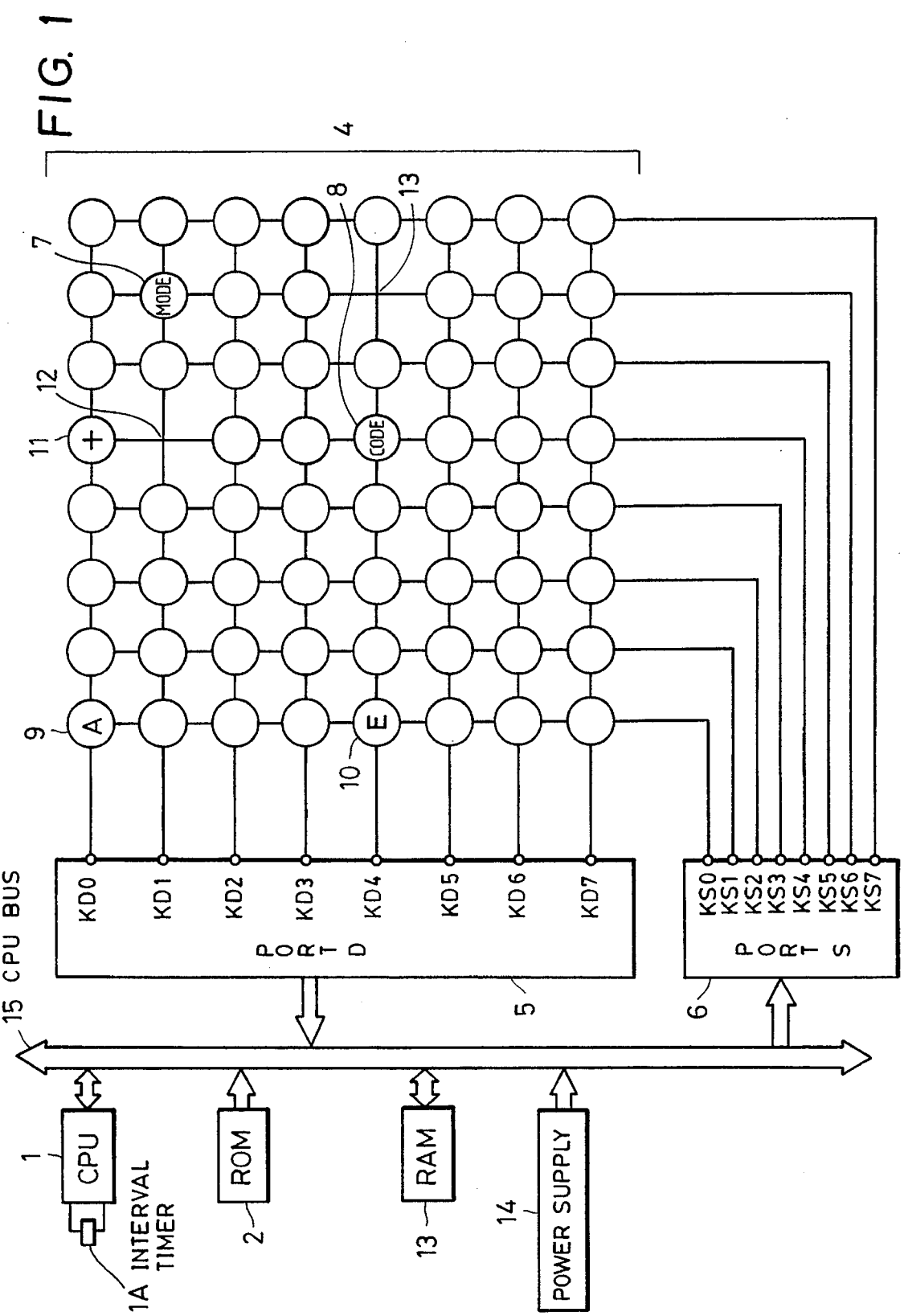

| FIG. 2A | FIG. 2B |

INPUT DEVICE

This application is a continuation of application Ser. No. 07/999,555 filed Dec. 31, 1992, now abandoned, which is a continuation of application Ser. No. 07/656,031 filed Feb. 15, 1991, abandoned, which is a continuation of application Ser. No. 07/308,635 filed Feb. 10, 1989, abandoned.

BACKGROUND OF THE INVENTION

1. Field of the Invention

This invention relates to an input device for inputting data from a keyboard, and more particularly relates to an input device which supplies a scanning signal to a key matrix of the keyboard checks the scanning signal returned from the key matrix and generates a signal corresponding to an operated key of the keyboard, a key roll-over function of the input device being improved.

2. Description of the Related Art

Keyboard devices for inputting key data are disclosed in U.S. Pat. Nos. 3,745,536 and 3,792,466, for example. In order to overcome a difficulty in the prior art in which, when three keys are depressed, the keyboard device responds as if four keys are depressed, the applicant has previously proposed a novel input device having a roll-over function to discriminate any new key, as disclosed in U.S. patent application Ser. No. 854,571, filed Apr. 22, 1986 now U.S. Pat. No. 4,833,447, issued May 23, 1989 and assigned in common herewith. The disclosure of U.S. Pat. No. 4,833,447 is incorporated in the present application by reference.

In the key matrix as described above, it may happen that, when three keys disposed at certain columns and certain rows of the keyboard are depressed, the key matrix responds in the same way as when four keys are depressed, and an erroneous data input is produced.

SUMMARY OF THE INVENTION

The present invention has solved the above-described problem. It is an object of the present invention to provide an input device which, even when plural keys are depressed, does not generate a signal corresponding to a key other than the depressed keys.

It is another object of the present invention to provide an input device which comprises an m×n matrix, a first key provided at a point of intersection of the m×n matrix, a second key provided at another point of intersection of the m×n matrix, supply means for supplying a scanning signal to said matrix, and prevention means for preventing said scanning signal from being output via the points of intersection where the row or column including said first key intersects the column or row including said second key.

It is still another object of the present invention to provide an input device which comprises an mi (i=1~m)×nj (j=1~n) matrix, a first key provided at a point of intersection of the m×n matrix, a second key provided at another point of intersection of the m×n matrix, supply means for supplying a scanning signal to the matrix, and generation means for generating, according to the scanning signal obtained from the matrix, a key signal corresponding to the scanning signal, the generation means preventing the generation of a key signal corresponding to an apparent key operation consisting of a simultaneous operation with one of the first key and the second key, by means of leaving unoccupied by keys the points of intersection where at least one of the row and column including the first key intersects the column or row including the second key.

It is a further object of the present invention to provide an input device which comprises an mi (i=1~m)×nj (j=1~n) matrix, a first key provided at a point of intersection of the m×n matrix, a second key provided at another point of intersection of the m×n matrix, a supply circuit, connected to rows or columns of the matrix, for supplying a scanning signal to the matrix, a generation circuit for generating a key signal corresponding to a key provided at a point of intersection of the matrix, according to the scanning signal obtained via a row or column of the matrix, and other keys disposed at points of intersection other than the determined points of intersection where the extension of at least one of the row and column including the point of intersection of the first key intersects the extension of the column and row, respectively, including the point of intersection of the second key, in order to prevent the scanning signal from being output via the determined points of intersection.

BRIEF DESCRIPTION OF THE DRAWINGS

FIG. 1 is a configurational diagram of an input device comprising an embodiment of the present invention.

DESCRIPTION OF THE PREFERRED EMBODIMENT

Figure 2A:
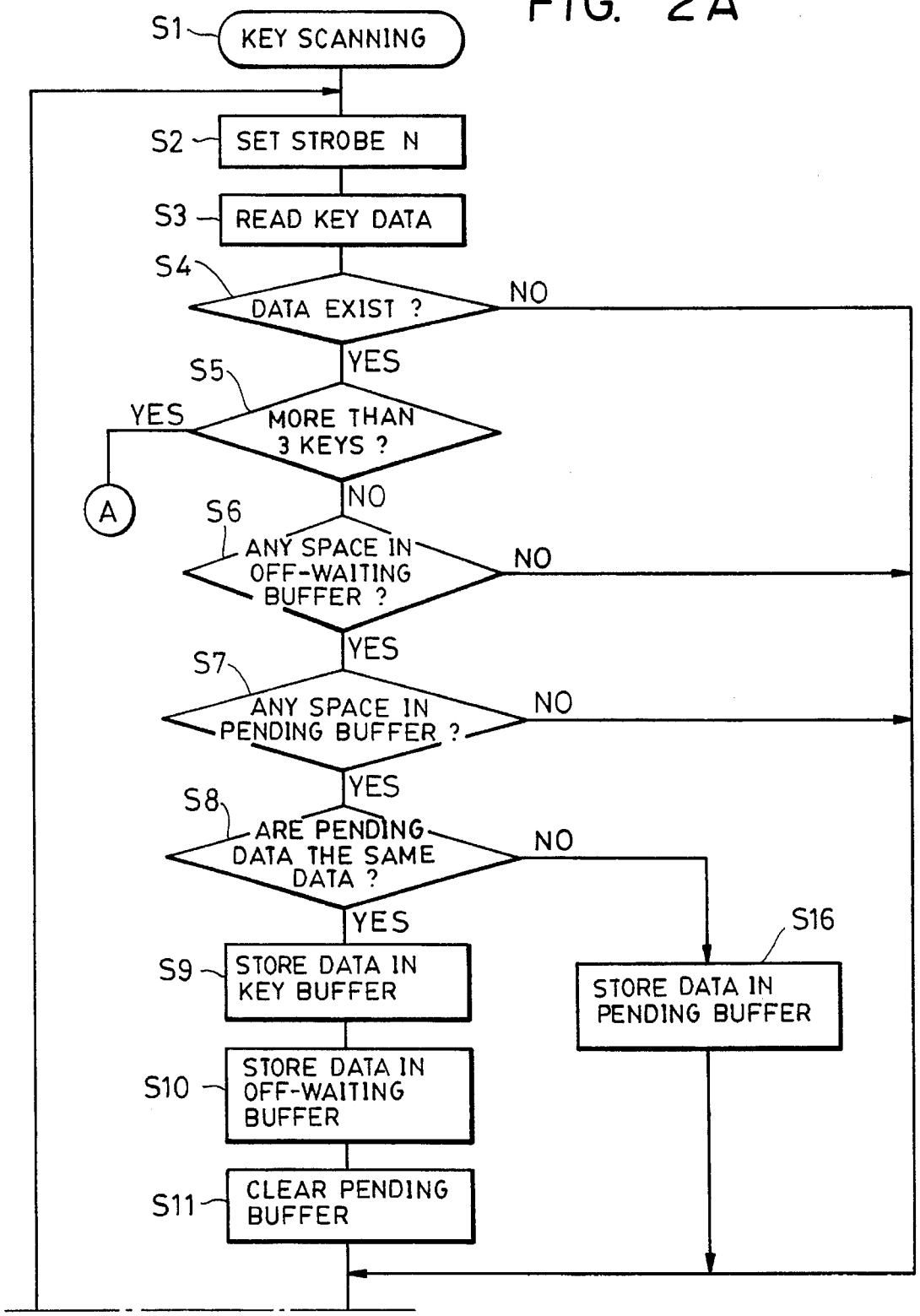
FIGS. 2A and 2B, is a flow chart of an operation of a typewriter to which an embodiment of the present invention is applied.

The present invention will hereinafter be explained in detail with reference to the drawings.

FIG. 1 shows a configuration of an embodiment of the present invention. A CPU (Central Processing Unit) 1 controls an entire input device in accordance with procedures read out from a ROM 2. An interval timer 1A generates signals at each predetermined time interval. The ROM 2 (Read-Only Memory) stores the program of a control procedure according to the flow chart shown in FIG. 2. A RAM (Random Access Memory) 3 stores various kinds of data.

A port D 5 reads key data from a key matrix 4, and has terminals KD0 through KD7. Key matrix 4 includes an array of rows and columns as illustrated in FIG. 1 wherein the rows and columns cross at points of intersection (e.g. 11, 12 or 13). As is well known in the art (e.g. U.S. Pat. No. 4,420,744), each intersection of a row and column provides a crosspoint switch which can be closed by pressing the conductors together. In FIG. 1, contact between a row and a column is made by depressing a key at the point of intersection of the row and column. A port S 6 outputs data to the key matrix 4, and has terminals KS0 through KS7.

An example of the arrangement of some keys on the key matrix 4 is indicated by numerals 7 through 11. Numerals 7, 8, 9, 10 and 11 indicate keys, "MODE" "CODE", "A", "E" and "+", respectively. Numerals 12 and 13 indicate the two points of intersection on the extensions of the rows and columns including the key "MODE" 7 and the key "CODE" 8. In accordance with the present invention, keys are not disposed at such points of intersection, which are left unoccupied.

There is also shown a power supply 14. A CPU bus 15 sends out address signals, data signals and control signals.

Next, the operations when keys are depressed will be explained. Suppose now the keys "A" 9, "E" 10 and "CODE" 8, which are keys on the key matrix 4, are simultaneously depressed. Then data are read in the port D 5 as if the key "+" 11 were depressed.

That is, since key "E" 10 lies on the same row as key "CODE" 8 and the same column as key "A" 9, when these three keys are simultaneously depressed, a connection is formed between the "CODE" key and the "A" key. This connection results in two responses to a signal being generated from KS4 in port S: a first, desired response at KD4 in port D indicating that the "CODE" key has been depressed, and a second, undesired response at KD0 of port D masquerading as a depression of key "+" 11. The signal of KS0 is sent to KD0 via keys "E" 10, "CODE" 8 and "+" 11 masquerading as a depression of key "A" 9. That is, when the key "CODE" 8, which is a special key, and other keys are depressed together, data are read in the port D 5.

However, when the special keys "CODE" 8 and "MODE" 7 and another key "A" are simultaneously depressed, another key is not read in the port D 5 as shown in the above case.

That is, when two special keys and one other key ("A" 9 in this case) are depressed, the other key is not read in the port D 5. This is because there are no contacts of the key "A" at positions where image data come up and masquerade as another key when the keys "CODE" 8 and "MODE" 7 are simultaneously depressed, i.e., at points of intersection 12 and 13 of the keys "CODE" 8 and "MODE" 7. As a result of no contacts by key depression at points of intersection 12 and 13, any other key can be depressed with special keys "code" and "mode" without a masquerade as another key.

Figures 2, 2B:
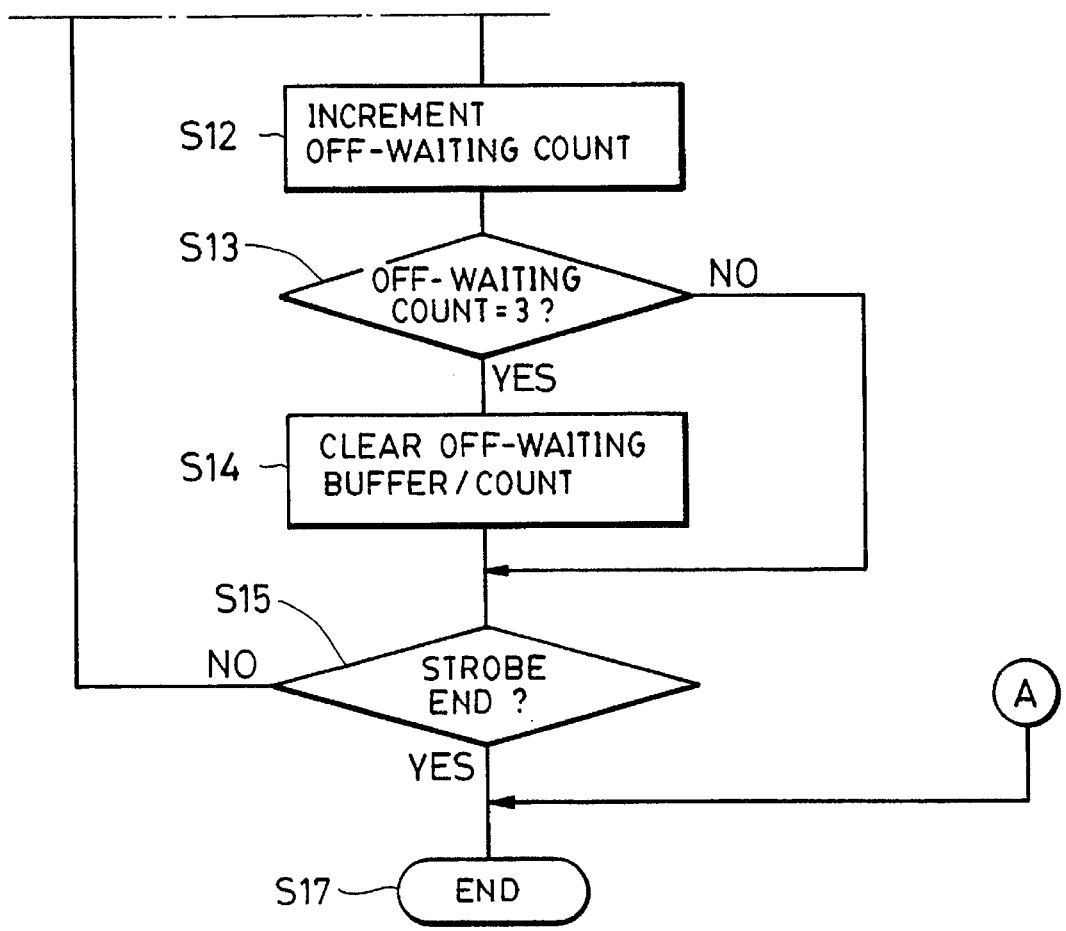
FIG. 2 including

Next, the operation of a typewriter to which an embodiment of the present invention is applied will be explained. The structure and roll-over processing of the typewriter are in accordance with, for example, applicant's input device disclosed in U.S. Pat. No. 4,833,447. FIG. 2 is a flow chart showing an interrupt process of the interval timer 1A which generates signals every 8 msec. A pending buffer identified in FIG. 2 is a storage area for removing on-chattering (i.e., debouncing) when keys are depressed. An off-waiting buffer is a storage area for removing off-chattering when keys are released. A key buffer is a storage area in which key codes recognized as having been switched on by depressing keys are to be stored. These buffers may be located, for example, in RAM 13.

When the interrupt occurs, the key scanning process is started at step S1. At step S2, strobe data are set at the port S 6. At step S3, key data are read by the port D 5.

Then the process is transferred to step S4, in which a judgment is made whether key data exist or not. When no key data exist, the process is branched from step S4 to step S12. When key data exist, the process is transferred from step S4 to step S5.

At step S5, an investigation is made whether or not the data read at step S3 correspond to more than 3 keys (i.e., 4 or more keys depressed simultaneously).

When the data correspond to more than 3 keys, the process is branched to step S17 as indicated by the symbol A. When the data correspond to fewer than 4 keys, the process is transferred to step S6.

At step S6, an investigation is made whether there is any space in the off-waiting buffer which exists in the RAM 3 or not. When there is no space, the process is branched to step S12. When there is space, the process is transferred to step S7.

At step S7, an investigation is made whether there is any space in the pending buffer in the RAM 13 or not. When there is no space, the process is branched to step S12. When there is space, the process is transferred to step S8.

At step S8, an investigation is made whether the data in the pending buffer and the data read at step S3 are the same data or not. When the data are different, the process is branched to step S16, the data read at step S3 are stored in the pending buffer, and then the process is transferred to step S12.

When the data coincide with each other at step S8, the process is transferred to step S9, in which the data are stored in the key buffer. At step S10, the same data as those at step S9 are also stored in the off-waiting buffer. Then, the process is transferred to step S11, in which the pending buffer is cleared.

At step S12, the off-waiting count within the RAM 13 is counted up. Then the process is transferred to step S13, in which an investigation is made whether the result of the count-up at step S12 is 3 or not. When the result is not 3, the process is branched to step S15. When the result is 3, the process is transferred to step S14, in which the off-waiting buffer and the off-waiting count are cleared.

Next, the process is transferred to step S15, in which investigation is made whether the strobe data to be output to the port S 6 are END or not. When the strobe data are not END, the process is branched to step S2, and the process is continued. When the strobe data are END, the process is terminated at step S17, and the system waits for the next interrupt.

The flow of the key scanning process has now been explained.

As explained above, it has been assumed in the present embodiment that the number of keys to be simultaneously depressed is three, but the number of such keys may be made four or more. In the case of four keys, for example, when three keys are limited, and keys are not disposed at the points of intersection on the extensions of the rows and columns of each of these three keys, image data are not generated regardless of whether any key is depressed as the fourth key to be depressed, and thus it is possible to recognize four-keys.

Further, in the present embodiment, keys are not disposed at either of the points of intersection on the extensions of the rows and columns including the two limited keys. However, a key may be disposed at either of the points of intersection, and it is also possible to recognize the simultaneous depressing of three keys, i.e., this key and the two limited keys. That is, since key data from positions where keys are not disposed have previously been recognized by software, only these image data, among key data, may be made not to be recognized as key data.

As explained above, in the present invention, it is arranged so that, by not providing keys at the points of intersection on the extensions of the rows and columns including at least two limited special keys on the key matrix, when these at least two limited special keys and another key are simultaneously depressed, only the at least three depressed keys can be recognized. Hence, the present invention has the effect that the operator is made strongly aware of the function which executes the input by the simultaneous depressing of not less than three keys in preference to the simultaneous depressing of two keys.

The present invention also has the effect that, in the operation of a device, the key inputs for operating functions such as "delete" or the like are made more difficult, and so the operator can be more conscious about the functions.

The above description has been given on a preferred embodiment of the present invention, but it will be apparent to those of ordinary skill in the art that many modifications may be made therein without departing from the scope of the invention, which is to be determined by reference to the appended claims.

What is claimed is:

1. An input device having at least three keys operating concurrently comprising:

an m×n matrix of intersecting scannable elements, where m and n are integers equal to a number of row elements and a number of column elements, respectively, keys for operatively connecting a row element and a column element that intersect being provided at selected points of intersection;

a first key provided at a first selected point of intersection of said m×n matrix for operatively connecting, when operated, a row element and a column element which intersect at said first selected point of intersection:

a second key provided at a second selected point of intersection of said m×n matrix for operatively connecting, when operated, a row element and a column element which intersect at said second selected point of intersection;

a point of intersection, at which at least one of the row and column elements that connect at the first selected point intersects one of the column and row elements, respectively, that connect at the second selected point being excluded from the selected points of intersection at which a key is provided whereby the first and second keys and operated concurrently with a third key at a third selected point of intersection without phantom keying; and generating means operative in response to said first key, said second key and said third key being operated concurrently for generating a key code signal.

2. An input device according to claim 1, wherein said row elements and said column elements comprise conductive material.

3. An input device according to claim 1, further comprising a supply means for supplying a scanning signal to said matrix.

4. An input device according to claim 1, further comprising a supply means for supplying a scanning signal to said column elements of said matrix.

5. An input device according to claim 1, further comprising a receiving means for receiving the scanning signal from said rows of the matrix through operated keys.

6. An input device comprising:

an m×n matrix of intersecting scannable elements, where m and n are integers equal to a number of row elements and a number of column elements, respectively;

keys for operatively connecting a row element and a column element that intersect being provided at selected points of intersection;

a first key provided at a first selected point of intersection of said m×n matrix for operatively connecting, when operated, a row element and a column element which intersect at said first selected point of intersection;

a second key provided at a second selected point of intersection of said m×n matrix for operatively connecting, when operated, a row element and a column element which intersect at said second selected point of intersection;

a point of intersection at which at least one of the row and column elements that connect at the first selected point intersects one of the column and row elements, respectively, that connect at the second selected point being excluded from the selected points of intersection at which a key is provided;

supply means for supplying a scanning signal to said matrix; and generation means operative in response to the scanning signal obtained from said matrix for generating a key code signal corresponding to the scanning signal when said first and second keys and a key provided at another selected point of intersection are depressed simultaneously.

7. An input device according to claim 6, wherein said row elements and said column elements comprise conductive material.

8. An input device according to claim 6, wherein said supply means comprises means for supplying a scanning signal to said matrix.

9. An input device according to claim 6, further comprising a supply means for supplying a scanning signal to the column elements of said matrix.

10. An input device according to claim 6, further comprising a receiving means for receiving the scanning signal from the rows of said matrix through operated keys.

11. An input device according to claim 6, wherein said generating means is operable when said receiving means receives said scanning signal.

12. An input device according to claim 10, wherein said generating means in not operable when said receiving means receives more than three scanning signals.

13. An input device comprising:

an m×n matrix of intersecting scannable elements, where m and n are integers equal to a number of row elements and a number of column elements, respectively;

keys for operatively connecting a row element and a column element that intersect being provided at selected points of intersection;

a first key provided at a first selected point of intersection of said m×n matrix for operatively connecting, when operated, a row element and a column element which intersect at said first selected point of intersection;

a second key provided at a second selected point of intersection of said m×n matrix for operatively connecting, when operated, a row element and a column element which intersect at said second selected point of intersection;

a point of intersection at which at least one of the row and column elements that connect at the first selected point intersects one of the column and row elements, respectively, that connect at the second selected point being excluded from the selected points of intersection at which a key is provided;

generation means operative in response to a scanning signal obtained from said matrix for generating a key code signal corresponding to the scanning signal when at least said first key, said second key and a key at another selected point of intersection are depressed simultaneously.

14. An input device according to claim 13, wherein said row elements and said column elements comprise conductive material.

15. An input device according to claim 14, further comprising a supply means for supplying a scanning signal to said matrix.

16. An input device according to claim 15, wherein said supply means comprises means for supplying a scanning signal to said column elements of said matrix.

17. An input device according to claim 16, further comprising a receiving means for receiving the scanning signal from the rows of said matrix through operated keys.

18. An input device according to claim 17, wherein said generating means is operable when said receiving means receives said scanning signal.

19. An input device according to claim 18, wherein said generating means is not operable when said receiving means receives more than three scanning signals.

\* \* \* \* \*

UNITED STATES PATENT AND TRADEMARK OFFICE
CERTIFICATE OF CORRECTION

PATENT NO. : 5,583,498
DATED : December 10, 1996
INVENTOR(S) : Mamoru Sakaki, et al.

It is certified that error appears in the above-indentified patent and that said Letters Patent is hereby corrected as shown below:

COLUMN 1

Line 62, "mi (i=1~m)xnj (j=1~n)" should read --m x n--.

COLUMN 2

Line 15, "mi (i=1~m)xnj (j=1~n)" should read --m x n--.

COLUMN 5

Line 43, "and" should read --are--.

COLUMN 6

Line 40, "in" should read --is--.

Signed and Sealed this

Sixth Day of May, 1997

BRUCE LEHMAN

Attest:

Attesting Officer

Commissioner of Patents and Trademarks